United States Patent
Jain et al.

(10) Patent No.: US 7,788,556 B2
(45) Date of Patent: Aug. 31, 2010

(54) SYSTEM AND METHOD FOR EVALUATING AN ERRONEOUS STATE ASSOCIATED WITH A TARGET CIRCUIT

(75) Inventors: Jawahar Jain, Santa Clara, CA (US); Subramanian K. Iyer, Austin, TX (US); Amit Narayan, Redwood City, CA (US); Debashis Sahoo, Stanford, CA (US)

(73) Assignee: Fujitsu Limited, Kawasaki (JP)

( * ) Notice: Subject to any disclaimer, the term of this patent is extended or adjusted under 35 U.S.C. 154(b) by 1374 days.

(21) Appl. No.: 10/390,982

(22) Filed: Mar. 17, 2003

(65) Prior Publication Data

US 2004/0093541 A1 May 13, 2004

Related U.S. Application Data

(60) Provisional application No. 60/426,207, filed on Nov. 13, 2002.

(51) Int. Cl.
*G01R 31/28* (2006.01)
(52) U.S. Cl. .............................. 714/724; 703/14; 716/4
(58) Field of Classification Search .................. 714/724
See application file for complete search history.

(56) References Cited

U.S. PATENT DOCUMENTS

| | | | |
|---|---|---|---|
| 5,920,711 A * | 7/1999 | Seawright et al. ............. 703/15 |
| 6,026,222 A * | 2/2000 | Gupta et al. .................... 716/5 |
| 6,086,626 A | 7/2000 | Jain et al. | |
| 6,112,022 A * | 8/2000 | Wei ............................. 703/14 |
| 6,131,078 A * | 10/2000 | Plaisted .......................... 703/2 |
| 6,292,916 B1 | 9/2001 | Abramovici et al. | |
| 6,308,299 B1 | 10/2001 | Burch et al. | |
| 6,321,186 B1 | 11/2001 | Yuan et al. | |
| 6,397,362 B1 * | 5/2002 | Ishiyama ..................... 714/724 |
| 6,473,884 B1 | 10/2002 | Ganai et al. | |
| 6,499,129 B1 | 12/2002 | Srinivasan et al. | |
| 7,092,858 B1 * | 8/2006 | Kukula et al. .................. 703/2 |

OTHER PUBLICATIONS

Larrabee, Tracy. "Test Pattern Generation Using Boolean Satisfiability". IEEE Transactions on Computer-Aided Design of Integrated Circuits and Systems, vol. 11, No. 1, Jan. 1992, pp. 4-15.*
English language text from an Office Action from the Patent Office of Japanese Patent Office, Application No. 2003-383344, 1 page, dated Jan. 13, 2009.
Narayan, et al., "Reachability Analysis Using Partitioned-ROBDDs", 1997 IEEE, pp. 388-393, 1997.
Cabodi, et al., "Can BDDs compete with SAT solvers on Bounded Model Checking?", pp. 117-122.

* cited by examiner

*Primary Examiner*—Kevin L Ellis
*Assistant Examiner*—Steve Nguyen
(74) *Attorney, Agent, or Firm*—Baker Botts L.L.P.

(57) ABSTRACT

A method for evaluating an erroneous state associated with a target circuit is provided that includes receiving information associated with a target circuit, the information identifying a property within the target circuit to be verified. One or more partitioned ordered binary decision diagram (POBDD) operations are executed using the information in order to identify an erroneous state associated with a sub-space within the target circuit. A path associated with the erroneous state is identified. The path reflects a correlation between an initial state associated with the erroneous state and a point where the erroneous state was encountered.

21 Claims, 2 Drawing Sheets

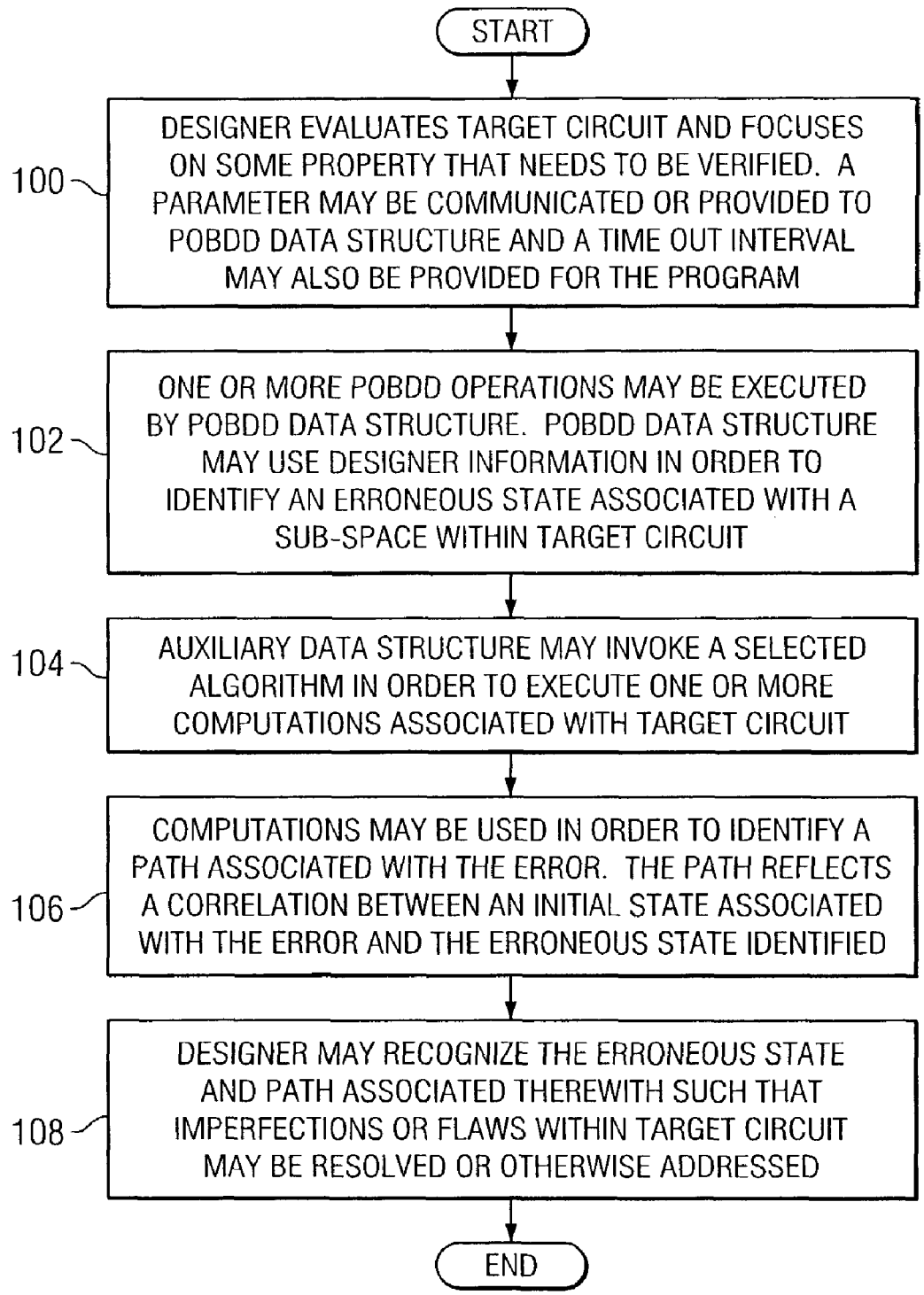

SYSTEM AND METHOD FOR EVALUATING AN ERRONEOUS STATE ASSOCIATED WITH A TARGET CIRCUIT

RELATED APPLICATIONS

This application claims priority under 35 U.S.C. §119 of provisional patent application Ser. No. 60/426,207 entitled: "Verifying a Circuit Using One or More Partitioned Ordered Binary Decision Diagrams (POBDDs)" filed Nov. 13, 2002.

TECHNICAL FIELD OF THE INVENTION

This invention relates in general to the field of integrated circuit verification and more particularly to a system and method for evaluating an erroneous state associated with a target circuit.

BACKGROUND OF THE INVENTION

The proliferation of integrated circuits has placed increasing demands on the design of digital systems included in many devices, components, and architectures. The number of digital systems that include integrated circuits continues to steadily increase and may be driven by a wide array of products and systems. Added functionalities may be implemented in integrated circuits in order to execute additional tasks or to effectuate more sophisticated operations in their respective applications or environments. Additionally, system parameters of integrated circuits may dictate that their operations be performed in an optimal time interval, which allows for even more operations to be accommodated in a given clock cycle. These rigorous demands associated with production and design generally result in the need for more advanced and complex verification processes and procedures.

Verification techniques are generally implemented in order to ensure that an integrated circuit or a digital element is capable of performing its intended functionality. In other cases, verification techniques may be used in order to ascertain whether a selected characteristic, behavior, or property is present in a given target circuit. Flaws or inaccuracies in an integrated circuit or a digital element may inhibit system functionality and/or cause significant operational problems in a corresponding architecture.

When an error, such as a violation in behavior associated with a circuit, is identified by a verification process, it may be valuable to identify more detailed information relating to the error. The more detailed information may be useful in identifying the exact location of the error and/or resolving the flaw in the target circuit. Accordingly, the ability to identify parameters or data associated with an integrated circuit or a digital element presents a significant challenge to digital system designers and integrated circuit manufacturers.

SUMMARY OF THE INVENTION

From the foregoing, it may be appreciated by those skilled in the art that a need has arisen for an improved verification approach that offers the ability to efficiently and quickly identify or collect information associated with an erroneous state of a target circuit. In accordance with one embodiment of the present invention, a system and method for evaluating an erroneous state associated with a target circuit are provided that substantially eliminate or greatly reduce disadvantages and problems associated with conventional verification, simulation, or validation techniques.

According to one embodiment of the present invention, there is provided a method for evaluating an erroneous state associated with a target circuit that includes receiving information associated with a target circuit, the information identifying a property within the target circuit to be verified. One or more partitioned ordered binary decision diagram (POBDD) operations are executed using the information in order to identify an erroneous state associated with a subspace within the target circuit. A path associated with the erroneous state is identified. The path reflects a correlation between an initial state associated with the erroneous state and a point where the erroneous state was encountered.

Certain embodiments of the present invention may provide a number of technical advantages. For example, according to one embodiment of the present invention, a verification approach is provided that is significantly faster than other verification or simulation approaches. This may be a result of the integration of an error-trace operation in conjunction with POBDD techniques. The error-trace operation may provide information that may be used to quickly identify a path corresponding to the erroneous state. The enhanced speed may further allow the verification approach to be implemented for a plethora of additional elements that have a large sequential depth or sophisticated circuitry.

Another technical advantage associated with one embodiment of the present invention relates to accuracy. Without determining more information associated with the identification of an erroneous state, such an identification may be meaningless. The architecture of the present invention provides computations associated with an erroneous state and may yield more accurate path determinations quickly. This is a result of the implementation of an auxiliary data structure that may be used to execute error-tracing and to collect information pertinent to the erroneous state encountered. Accordingly, the system offered in accordance with the teachings of the present invention can accommodate a wide array of complex circuits, which allows verification to be executed quickly and accurately deep into circuits where other methods may be restricted. Certain embodiments of the present invention may enjoy some, all, or none of these advantages. Other technical advantages may be readily apparent to one skilled in the art from the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which:

FIG. 2 is a flowchart illustrating a series of example steps associated with a method for evaluating an erroneous state associated with a target circuit in accordance with one embodiment of the present invention.

DETAILED DESCRIPTION OF EXAMPLE EMBODIMENTS

Figure 1:
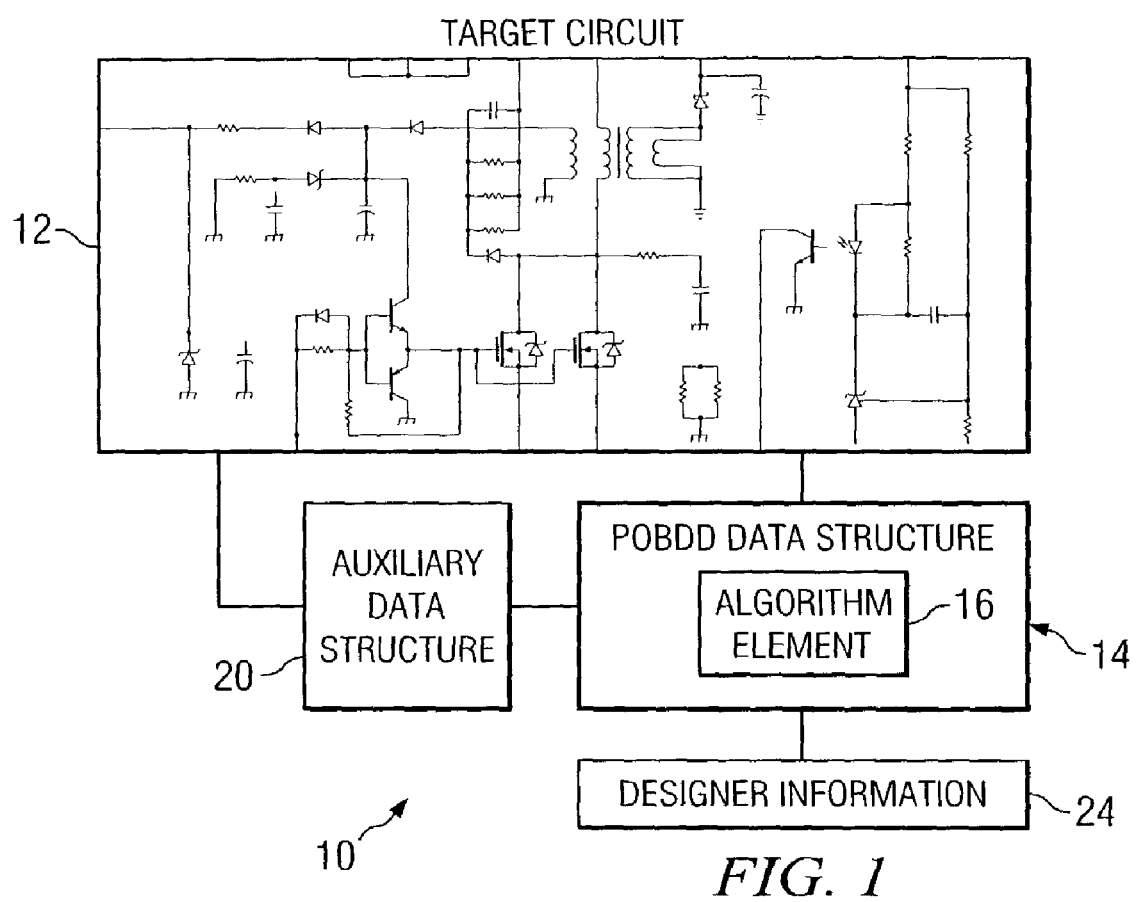
FIG. 1 is a simplified block diagram of a system for evaluating an erroneous state associated with a target circuit in accordance with one embodiment of the present invention.

FIG. 1 is a simplified block diagram of a system 10 for evaluating an erroneous state associated with a target circuit 12. System 10 may include a partitioned ordered binary decision diagram (POBDD) data structure 14 that includes an algorithm element 16. Additionally, system 10 may include an auxiliary data structure 20 and a segment of designer information 24 that may be communicated to POBDD data structure 14. System 10 may generally be positioned within, or otherwise operate in conjunction with, any integrated circuit, digital element, processing configuration, or binary architecture in which verification procedures or processes may be implemented. Additionally, system 10 may be provided in cooperation with any device, component, hardware, software, object, or element associated with the digital processing of information or data.

According to the teachings of the present invention, system 10 operates to provide an element associated with the verification process that is capable of evaluating an erroneous state within target circuit 12. By invoking auxiliary data structure 20, which may keep a trace or record associated with computations in terms of partitions processed, communications that took place between a pair of partitions, or time intervals relating to the duration of these computations for example. This may allow an end user to maintain an accurate record of the origins or lineage associated with a particular state. By storing and maintaining this information in terms of a frontier of states (i.e. the new state added during each step of reachability) the total space complexity of an analysis may be minimized. Each node may represent a frontier of states in a POBDD computation. The analysis may then be carried out to determine which states are the parent states of the flawed or erroneous state. The process may then be repeated until the initial state is reached. A single state generally represents an initial state that is predominantly shallow. The process may result in a significant advance in efficacy for the verification procedure because of the detailed information being provided by the computations that are generated by auxiliary data structure 20.

System 10 may be significantly faster than other verification or simulation approaches. This may be due, in part, to the integration of an error-trace algorithm in conjunction with POBDD techniques. The enhanced speed may further allow the verification approach to be implemented for a plethora of additional elements that include a large sequential depth or sophisticated circuitry.

System 10 may also provide enhanced accuracy in exploring or identifying erroneous states associated with target circuit 12. Without determining more information associated with an erroneous state, an identification of a flaw within target circuit 12 may be meaningless. The architecture of system 10 provides computations that may yield more accurate path determinations quickly. This is a result of auxiliary data structure 20 that may be used to execute error-tracing operations associated with an erroneous state that is encountered.

System 10 may also extend reachability parameters associated with target circuit 12. New or unexplored deep states within target circuit 12, that would otherwise not be visited, may be uncovered using system 10. Deep states are generally difficult to reach or to find in using satisfiability (SAT) procedures, or binary decision diagram (BDD) operations to execute verification of a given target circuit. System 10 can accommodate a more complete analysis, which allows verification to be executed deep into circuits where SAT and BDD methods are restricted. In a general sense, the architecture of system 10 operates to combine error-trace protocols with POBDD processes in order to provide a more effective verification process. Simultaneously, system 10 may achieve a significant reduction in latency associated with the verification process because of the computations being maintained during the exploration process.

Additionally, system 10 may include an error trace data structure that can be annotated with information about the time it took for each successive step of image computation (i.e., to go from one set of states to the next). Therefore in retracing a path, if there are multiple ways of going from the error to an initial state, it can perhaps choose a "quicker" path using the annotations, under the assumption that traversing in the forward and backward directions have substantially similar time complexity. Thus, the error trace data structure can be annotated with any information that can be of computational use later on such as time, space (peak as well as average), depth, "goodness criterion" measuring the conjunction/quantification schedule, reordering statistics (largest graph reordered until this point, number of reordering calls), or number of communications that have been made to this node "n" (set of states) in the previous communications for example. This information may be properly stored and maintained in system 10.

Target circuit 12 is an electronic or digital object sought to be tested in order to verify that it operates according to its prescribed or intended functionality. The integrity, validity, or design specifications of a sub-space within target circuit 12 may be analyzed using POBDD data structure 14. Target circuit 12 may include any associated circuitry, inclusive of logic gates, counters, inverters, buffers, or any other suitable devices, components, or objects capable of cooperating or interacting with target circuit 12. Target circuit 12 may alternatively be any other suitable device, component, architecture, arrangement, hardware, software, object, or element capable of processing binary data or digital information in a verification environment. Target circuit 12 may be designed specifically to include (or be capable of performing) some property. The term 'property' as used herein in this document is inclusive of any capability, characteristic, operation, action, or behavior that may be associated with target circuit 12. In operation, target circuit 12 may be verified or otherwise validated in order to ensure that it maintains its designated property or characteristic, or that it performs a prescribed operation properly.

POBDD data structure 14 is an element operable to execute partitioning of BDD elements in a binary or digital environment. POBDD data structure 14 may represent or otherwise generate a Boolean function for manipulation in system 10. As referred to herein, POBDD data structure 14 may be inclusive of a partitioned reduced order binary decision diagram (PROBDD) or BDD data structures (potentially with partitioning) where appropriate. The terms PROBDD and POBDD are interchangeable and generally represented in various suitable fashions (for purposes of brevity in certain cases) in describing their applications. POBDD data structure 14 may receive designer information 24 and perform a preliminarily analysis on target circuit 12 in order to retrieve a set of states based on designer information 24. POBDD data structure 14 may invoke one or more algorithms included in algorithm element 16 in order to evaluate a selected property associated with target circuit 12. As the set of states is being identified, auxiliary data structure 20 may be executing any number of computations that are stored and that may be later recalled in order to glean information associated with an encountered erroneous state. The term 'erroneous state' as used herein in this document is inclusive of any flaw, glitch, imperfection, or error that may be included in target circuit 12. This is inclusive of any behavior that may be violated or any designated characteristic that is not displayed.

POBDDs are generally canonical and, therefore, may be used for combinational equivalence checking. POBDDs may be successively applied in reachable analyses for sequential circuit verification. Reachable state sets may be represented as POBDDs. This minimizes the memory requirement by only keeping one partition in a corresponding memory during a given time interval. Additionally, fixed point computations may be performed on each partition separately using reachability algorithms, which may be included within algorithm element 16, in conjunction with POBDD protocols that are effectuated by POBDD data structure 14.

In operation of an example embodiment, a designer or a manufacturer may write some program that identifies a property, characteristic, operation, or behavior that is sought to be tested or verified in target circuit 12. The property or characteristic may be suitably written in a particular syntax before it is communicated to POBDD data structure 14. The program may then be properly communicated to POBDD data structure 14, whereby POBDD data structure 14 tests the specified property in target circuit 12. POBDD data structure 14 may then generate a set of states and represent the set in a BDD format.

By invoking or implementing a selected algorithm within algorithm element 14, POBDD data structure 14 may selectively explore deep into target circuit 12 without looking at an entire circuit architecture or configuration. Viewing an entire circuit element may slow the verification process significantly. Instead, algorithm element 16 may be invoked such that predetermined locations within target circuit 12 are visited in order to evaluate a small fragment of states (within sub-spaces) in a deep manner.

In evaluating a portion of target circuit 12, POBDD data structure 14 may identify an error or erroneous state included within target circuit 12. This is the first part in the procedure of verifying a particular location within target circuit 12. The error may be associated with behavior or properties that are improper or inappropriate for target circuit 12. In a second part of the procedure, system 10 may be used to determine an initial point associated with the error that was encountered. Paths may be identified and an exact or otherwise accurate trace may be recognized in order to reach the initial state.

The determination or evaluation associated with erroneous states may be divided into two segments generally. In a first segment, the representation of a Boolean function for manipulation is provided by POBDD data structure 14. In a second segment, the computation that is calculating sets of states is generated. The path that is taken from moving from one subset of states to another subset of states may be identified. The path may terminate when the initial state is reached. In addition, computations may be made as to which subsets may be used in order to determine or otherwise reach other subsets and other suitable parameters may also be derived, such as how much time it takes to effectuate this operation, or how much memory was used to during this procedure for example. Additionally, descriptive annotations (as described above) may be implemented during such an operation.

The initial state may be targeted because it represents the state that is available to an end user. Target circuit 12 may typically have an initial state when the circuit is powered on. If target circuit 12 begins from that initial state, when an error is encountered later, a designer may wish to establish conclusively that something is incorrect or an erroneous state is present. A given set of input combinations is provided, which if applied yields or reaches the erroneous state where flawed behavior is displayed or demonstrated. Once the erroneous state has been obtained, the path back from the erroneous point to the original initial state may then be traced. Once this path has been identified it may be used to illustrate or demonstrate to the designer that if a procession is made along the identified path using the given sequence, the erroneous state will be reached.

Algorithm element 16 is a data processing object that may include one or more algorithms that allow for a specific or designated property to be explored or verified in target circuit 12. Algorithm element 16 may also include one or more algorithms associated with computations for target circuit 12. These algorithms may be invoked by auxiliary data structure 20 and include any suitable operations or protocols, such as error-trace elements for example. Algorithm element 16 may be included within POBDD data structure 14 or provided external thereto in accordance with particular processing needs, configurations, or arrangements. Additionally, algorithm element 16 may communicate with any other external component that provides one or more instructions or characteristics to be used in verifying sub-spaces within target circuit 12. Moreover, algorithm element 16 may directly receive designer information 24 in order to verify one or more properties associated with target circuit 12. Designer information 24 may also include or specify the type of circuit or element being subjected to the verification process. Algorithm element 16 may include any suitable hardware, software, object, or element operable to facilitate the verification operations being executed by POBDD data structure 14.

Auxiliary data structure 20 is an element operable to execute various computations associated with parameters of target circuit 12. Auxiliary data structure 20 may use or invoke algorithm element 16 such that when it operates on the data provided by target circuit 12, it is able to make the designated computations. Auxiliary data structure 20 may trace erroneous states that are encountered within target circuit 12. Auxiliary data structure 20 may include any suitable software, hardware, component, device, object, or element operable to execute one or more computations on target circuit 12. Additionally, auxiliary data structure 20 may be included within POBDD data structure 14 or positioned in any other suitable location where appropriate. In addition, auxiliary data structure 20 may include a portion of algorithms to be used in executing computations for target circuit 12. Alternatively, auxiliary data structure 20 may be provided with instructions external to system 10 such that the appropriate computations are executed and provided to an end user.

In operation, a program may be written using software that contains an algorithm that is able to interpret a given data structure with respect to target circuit 12 and BDDs. The data structure may be understood or analyzed by an algorithm, such as an error-trace algorithm for example. The error-trace algorithm may be capable of interpreting the data structure with respect to target circuit 12 and with respect to partitioned BDDs. The error-trace algorithm may generally contain two parts. The first part may be associated with POBDD data structure 14 and the error-trace may offer a manner in which to store various paths such that once an erroneous point is determined, a path may be created going to back to the initial state. In the second part, when encountering multiple paths, the error-trace algorithm may dictate an optimal (or most efficient) path in which to trace.

In another example, system 10 may provide an architecture that allows a determination to be made of the presence of an erroneous state with greater specificity. For example, the gating configuration or logic (e.g. AND, OR, XOR, and XNOR gates) is flawed, a connection is incorrect, a faulty wire coupling is present, or a specification has been misread or misinterpreted. Thus, in addition to locating an erroneous state, more information may be derived about the erroneous behavior. A sequence of input combinations may be identified that can move or propel the design from the initial state to the erroneous state.

A designer may then be able to see which combination is associated with a given path of the circuit. Based on this information, the designer may remove possibilities concerning what is flawed or incorrect in separating what is suspect from what is valid. The designer may determine, with reasonable specificity, the parts of a circuit that are behaving up to expectations and which are not obeying the designated or prescribed properties.

In an example implementation, error-trace computations are made by auxiliary data structure 20 while the first part of the verification procedure is being executed. POBDD data structure 14 may capture a set of states and make a series of computations associated with those states (e.g. states one through one hundred). After this computation has been made, a second computation may be made associated with states one through one hundred ten, whereby states one hundred one through one hundred ten are new states and the previous one hundred states are already known. The new ten states may be referred to as a 'frontier.' The new ten states may be represented as BDD and be properly stored on a disk, in memory, or in any other suitable storage medium. A flag may be attached to this set of states that explains which partition they belong to and provide further information detailing where the states came from, and how much time it took to arrive at those states. This reflects operations of auxiliary data structure 20 that are associated with a number of parameters, such as how such a point was reached, which window was being worked on, how much time it took to arrive at this point, or how much memory was consumed for example.

Error-trace elements within auxiliary data structure 20 may be generally associated with the storage and retrieval of computation paths. The concept reflects an attempt to record every image computation in a tree. Image computation may occur from a source partition to a destination partition. Each record may comprise the starting set in a source format (image computation (fixed-point or communication) and the image computed in destination). It may also contain a mechanism to undo this computation. Such a node may be referred to as an error-trace node. In an example configuration, an error-trace node may be added by each compute image as follows. If compute image generates new states, then this is stored in an error-trace node. The node may contain the BDD for the states, (f) and the window function (w) for the current partition. It may also contain a pointer to the frontier of the partition that contains the predecessor states of f.

There are a number of computations that may be executed by auxiliary data structure 20. For purposes of example, three general classes of storage at computation steps are provided in greater detail below. The three types are error-trace, partition frontier, and error-trace node. Error-trace may store the segments or leaves of an entire tree of computation. For each state s in the set of reachable states S, the tree may contain the location where the state s was first added to the reachable set S. The structure may have the information to find a path from any reachable state back to the initial states. For each partition that has been created, the set of states forming the current frontier (leaf corresponding to that partition) is stored. Once a frontier is identified, for each node of the frontier, the previous frontier may be selected and used to back trace to the initial states.

Partition frontier represents the set of states that form the current frontier of any given partition. Frontier may be generally defined as the states added in the most recent communications to the partition (possibly one from every other partition) and the subsequent run least fix point computation. The set of states introduced by each of the above computations may be stored in a separate error-trace node as a BDD. Thus, partition frontier may be an actual collection of sets (i.e. BDDs), whose set theoretic union (i.e., BDD disjunction) represents the set the reachable states that have been added in this partition but that have not yet been used for communication to other partitions.

Error-trace node represents a node of the computation tree. Error-trace node may store a BDD corresponding to the set S of states introduced in a single step of image computation. The following information may also be stored: how created_ (type of the computation done to get the set S), prev_ (back pointer to the set of BDDs, each of which may be a candidate from which states in S could have been generated. Every state in 'S' may be generated from one of the states in one of the BDDs of prev_. This is an object of type partition frontier), id_ (a unique number for this node), frontier_ (BDD representation of set 'S' defined above), and window_ (compute image has a from_ partition and a to_ partition. Window_ is the window function of from_ partition.).

In addition to (or in conjunction with) error tracing, auxiliary data structure 20 may include any number of suitable algorithms operable to execute computations associated with target circuit 12. These algorithms may be stored within auxiliary data structure 20 or provided external thereto, such as within algorithm element 16 for example. The algorithms may be operable to execute any number of calculations. For example, a storage algorithm may be implemented that identifies how the trace is stored during forward computation. For each partition, a frontier may be maintained that stores the current set of frontier states as a set of BDDs. The frontier can comprise many such BDDs, some of them being introduced by the various stages of the most recent run-least-fixpoint and others being introduced by the most recent communication from (possibly) every other partition.

The number of BDDs in this frontier can be, in a worst case scenario, provided as: $O(M+d\_i)$, where M is the number of partitions, and $d\_i$ is the depth of fix-point in the i-th partition. For a corresponding graph, this may, in the worst case scenario, be $O(M*(M+d\_max))$, thus, the error trace data structure can be annotated with any information that can be of computational use later on such as time, space (peak as well as average), depth, "goodness criterion" measuring the conjunction/quantification schedule, reordering statistics (largest graph reordered until this point, number of reordering calls), or number of communications that have been made to this node "n" (set of states) in the previous communications for example. In the case of fixpoint, the source and target may be the same partition, so the BDD may be stored in a manager element for that partition. In the case of communication, the frontier BDD may be stored in the manager element of the destination partition, and the window may correspond to that of the source partition.

A path retrieval algorithm may also be implemented or utilized by auxiliary data structure 20. In order to retrieve a path from an initial state to given state (s), the following steps may be followed. First, the node in the computation tree that contains this state may be identified. Generally this node or at least the frontier containing this set may be available when the state s is discovered. Therefore such a set may be provided to the recovery routine. Otherwise, the entire computation tree may be scanned to determine such a node. Second, given node $N\_i$, it may be determined that is has the predecessor partition frontier $P\_\{i+1\}$. The node $N\_\{i+1\}$ in $P\_\{i+1\}$ that contains a state $s\_\{i+1\}$, which is a single-step predecessor of state $s\_i$, may then be obtained. Third, a re-curse may be executed on step two with successive values of i until some N_k is the root node of the computation tree, i.e. the node containing the initial states. Fourth, the path s_0 ... s_i ... s_k represents a path from bad state s to initial state. It can be reversed to get a path from initial states to required state s.

For purposes of example and teaching only, details relating to algorithm implementation specifics are provided below. The following description has been offered for purposes of illustration only and, thereby, should not be construed to limit the applications or flexibility of the particular algorithm being implemented (or used) by auxiliary data structure 20.

There are generally three different types of computations within an error-trace protocol. The first is run least fix point. In cases where compute image generates new states, then a new error-trace node is created whose previous pointer is assigned to the frontier set. This node may be added to the frontier for that partition. The second type of computation is a communication from partition i to j. If compute image generates new states then a new error-trace node is created whose previous pointer is assigned to the (old) frontier set before communication commenced. Such a node may be added to the frontier set of j. The third type of computation is repartition and may be used with partition i in creating partitions i, r and s. The frontier for each of i, r, and s may be set to the frontier of i. There is generally no new error-trace node that needs to be created.

For additional purposes of explanation, an example invention is provided. A computation tree may be generated in the following manner. Presume that there is initially one partition. It undergoes one step of −I computation in which new states are added. It may then be split statically into two partitions (due to n=1, or due to n>1 m=2), the partitions are numbered one and two. Both partitions have two steps in run-least-fix-point each, i.e. the no new states are added when it is split. The partitions may then communicate. After this, there is another fixpoint computation. A blowup may then occur in partition two, resulting in three new partitions being created by dynamic repartitioning, numbered as two, three and four. Fixpoint may then be run on partition four. One of the states in partition four may be flawed and it may be appropriate to trace this state back. Other fixpoints are generally not run because of early return.

For purposes of teaching and example, some of the principles and concepts associated with POBDD, PROBDD, and BDD operations are provided below. The proffered description is only being provided to assist in the understanding of some of the complex theorems associated with partitioned BDD technology. The description should not be construed to limit any of the operations of any of the elements of system 10. It is imperative to recognize that the following description is for purposes of example only and should not be interpreted to restrict any other suitable operations that may be executed by POBDD data structure 14 or any other element involved in partitioning operations or the verification process.

In order to describe partitioned ROBDDs, it is useful to consider the following example. Assume a Boolean function f:B$^n$→B defined over n inputs $X_n=\{x_1, \ldots, x_n\}$. The partitioned-ROBDD representation $X_f$ of f is defined as follows:

Given a Boolean function: $f:B^n \to B$ defined over $X_n$, a partitioned-ROBDD representation $X_f$ of f is a set of k function pairs, $\chi_f = \{(\omega_1, \bar{f}_1), \ldots, (\omega_k, \bar{f}_k)\}$ where, $\omega_i B^n \to B$ and $\bar{f}_i:B^n \to B$, for $1 \leq i \leq k$, are also defined over $X_n$ and satisfy the following conditions:

1. $w_i$ and $\bar{f}_i$ are represented as ROBDDs with the variable ordering $\pi_i$, for $1 \leq i \leq k$.
2. $w_1+w_2+\ldots+w_k=1$
3. $\bar{f}_i=w_i \wedge f$, for $1 \leq i \leq k$ In the example provided, + and ∧ represent Boolean OR and AND respectively. The set $\{w_i, \ldots, W_k\}$ is denoted by W.

Each $w_i$ may be referred to as a window function. Intuitively, a window function $w_i$ may represent a part of the Boolean space over which f is defined. Every pair $(w_j, \bar{f}_i)$ may represent a partition of the function f. In, the example, the term "partition" is not being used in the sense where partitions have to be disjoint. If, in addition to conditions 1-3 (provided above), $w_i \wedge w_j=0$ for $i \neq j$, then the partitions may be orthogonal. Each $(w_j, \bar{f}_i)$ may now be considered a partition in a conventional sense.

In constructing partitioned ROBDDs, the performance of partitioned ROBDDs generally depends on the ability to generate effective partitions of the Boolean space over which the function can be compactly represented. The issue of finding adequate partitions of the Boolean space is central to the partitioned-ROBDD representation. Described herein are example heuristics, which may be effective in generating compact, orthogonally partitioned-ROBDDs. Although a Boolean netlist is used in the present approach, the techniques described are general and may be applied or extended to any arbitrary sequence of Boolean operations.

In an example BDD partitioning approach, the number of windows may be decided either a priori or dynamically. After a window $w_i$ is decided, a partitioned-ROBDD corresponding to it may be obtained by composing F in the Boolean space corresponding to the window $w_i$. In partitioning, the BDD for some function F, a decomposed BDD representation (i.e., a BDD which is not in terms of input variables but in terms of some pseudo-input variables that are created in the process of building BDDs for the given target function F) is considered. To create the partitioned BDD for F, its corresponding decomposed BDD may be analyzed to yield the partitions. The partition decision may be typically taken because the decomposed BDD for F in terms of its decomposition points, $\Psi_1, \ldots, \Psi_k$ cannot be composed. Note, the partitioned BDD for F, from its decomposed BDD, may be created in following three ways:

(1) Partition using input variables. The number of input variables may be changed dynamically or can be set to a predetermined constant.
(2) Partition using "internal" variables, i.e., variables that are not input variables. Such variables can be pseudo-variables introduced at internal gates.
(3) Partition using a suitable combination of 1 and 2.

At any given point in time in the present filtering based verification process a decomposed representation may be reflected by, $f_d(\Psi, X)$, of F where $\Psi=\{\psi_1, \ldots, \psi_k\}$ is called a decomposition set and it corresponds to the internal cut set selected, typically, by the naive cut or the smart cut process, and each $\psi_i \in \Psi$ is a decomposition point. Let $\Psi_{bdd}=\{\psi_{1_{bdd}}, \ldots, \psi_{k_{bdd}}\}$ represent the array containing the ROBDDs of the decomposition points, i.e., each $\psi_i \in \Psi$. has a corresponding ROBDD, $\psi_{i_{bdd}} \in \Psi_{bdd}$, in terms of primary input variables as well as (possibly) other.$\psi_j \in \Psi$., where $\psi_j \neq \psi_i$. Similarly, the array of $\psi_{i_{bdd}w_i}$ may be represented by $\Psi_{i_{bdd}w_i}$. The composition [?] of.$\psi_i$ in $f_d(\Psi, X)$ may be denoted by $f_d(\Psi, X)\cdot(\Psi_i \leftarrow \psi_{i_{bdd}})$, where, $$f_d(\Psi,X)\cdot(\psi_i \leftarrow \psi_{i_{bdd}}) = \overline{\psi_{i_{bdd}}} \cdot f_{d\overline{\psi_i}} + \psi_{i_{bdd}} f_{d^-\psi_i} \quad (1)$$

The vector composition of the $\Psi$ in $f_d(\Psi, X)$ may be denoted by $f_d(\psi, X) \cdot (\psi \leftarrow \psi_{bdd})$ and may represent a successive composition of $\psi_i$'s into $f_d$.

In considering partitioning of a decomposed representation, given a window function $w_i$, a decomposed representation $f_d(\Psi, X)$, and the ROBDD array $\Psi_{bdd}$ of f, $f_i$ is sought such that the ROBDD representing $f_i = w_i \wedge f_i$ is smaller than f. It can be shown that all $w_i$, which may be nothing but cubes, may satisfy this requirement.

Given $f_d$, $\Psi_{bdd}$, and $w_i$s, the cofactors $\psi_{w_i}$ and $f_{d_wi}$ may be created. By composing $\psi_{bdd_i}$, in $F_{dwi}$, the partition function $f_i = f_{w_i} f_i = f_{wi}$ may be achieved. Thus, given a set of window functions $w_i$, the partitioned-ROBDD $\chi_f$ of f may be given by $\chi_f = \{(w_i, w_i \wedge f_{wi}) | 1 \leq i \leq k\}$. It is generally easy to check that the above definition satisfies all the conditions of Definition 1.

If $w_i$ is a cube, $f_i$ has a smaller size than the ROBDD for f. Also, the ROBDD representing $w_i$ has k internal nodes where k is the number of literals in $w_i$. Because $w_i$ and $f_{wi}$ have disjoint support, $|\bar{f}_i| = w_i \wedge f_i| = (k+|f_i|) \approx |f_i|$. Also, because each intermediate result of building $f_i$ will be smaller than that of building f, the intermediate peak memory requirement is also reduced. This may not be true in the presence of dynamic variable reordering when f and $f_i$ can have different variable orderings. In practice, because dynamic variable reordering operates on smaller graphs in the case of partitioning, it is even more effective.

When the window function is a more complex function of PIs than a cube, $f_i = f_{w_i}$ may be used. $f_{w_i}$ is the generalized cofactor of f on $w_i$. The generalized cofactor of f on $w_i$ is generally much smaller than f. But in the example case provided, the size of the $i^{th}$ partitioned-ROBDD $|\bar{f}_i|$ can be $()(|w_i||f_i|)$ in the worst case. To avoid this, while using general window functions, $w_i$s may be used, which is generally small.

With regards to the selection of window functions, after deciding how to construct the partition function from a given window function, methods to obtain appropriate window functions may be evaluated. The methods may be divided into two categories: a priori selection and "explosion" based selection.

In a priori partitioning, a predetermined number of primary inputs (PIs) is selected to partition. If it is decided to partition on 'k' PIs, then $2^k$ partitions are created that correspond to all the binary assignments of these variables. For example, if it is decided to partition on $x_1$ and $x_2$, four partitions may be created: $x_1 x_2, x_1 \overline{x_2}, \overline{x_1} x_2$ and $\overline{x_1 x_2}$. For a given window function of this type, partitioned-ROBDDs can be created, which are guaranteed to be smaller than the monolithic ROBDD. Because only one partition needs to be in the memory at a given time, success is highly likely in the selected space. The reduction in memory is large and may be accompanied by an overall reduction in the time taken to process all partitions as well.

Variables should be selected that maximize the partitioning achieved while minimizing the redundancy that may arise in creating different partitions independently. This reflects a fundamental principle of many divide and conquer approaches. The cost of partitioning a function f on variable x may be defined as:

$$cos t_x(f) = \alpha[p_x(f)] + \beta[r_x(f)] \quad (2)$$

where $p_x(f)$ represents the partitioning factor and is given by, $$p_x(f) = \max\left(\frac{|f_x|}{|f|}, \frac{f_{\bar{x}}}{f}\right) \quad (3)$$

and $r_x(f)$ represents the redundancy factor and is given by, $$r_x(f) = \left(\frac{|f_x + f_{\bar{x}}|}{|f|}\right) \quad (4)$$

A lower partitioning factor may be beneficial as it implies that the worst of the two partitions is small and similarly a lower redundancy factor is beneficial because it implies that the total work involved in creating the two partitions is less. The variable x that has the lower overall cost is chosen for partitioning.

For a given vector of functions F and a variable x, the cost of partitioning may be defined as:

$$cost_x(F) = \sum_{i=1}^{k} cost_x(f_i)$$

The PIs may be numbered in increasing order of their cost of partitioning $f_d$ and $\Psi$ and the best 'k' (where 'k' is a predetermined number specified by the user) may also be selected. Using a similar cost function, PI variables may be selected as well as pseudo-variables, such as a.$\psi_{i_{bdd}}$ expressed in terms of PIs, to create partitioned-ROBDDs. In the example case, the cofactor operations may become generalized cofactor operations for window functions that are non-cubes. This type of selection, where all the PIs are ranked according to their cost of partitioning $f_d$ and $\Psi$ is called a static partition selection.

Alternatively, a dynamic partitioning strategy may be used in which the best PI (e.g. x) is selected based on $f_d$ and $\Psi$ and then the subsequent PIs are recursively selected based on $f_{d_x}$ and $\Psi_x$ in one partition and in $f_{d_{\bar{x}}}$ and $\Psi_{\bar{x}}$ in the other partition. The dynamic partitioning method may require an exponential number of cofactors and can be cost-prohibitive in certain circumstances. The cost can be somewhat reduced by exploiting the fact that the only values that are of interest are the sizes of the cofactors of $f_d$ and $\psi_{i_{bdd}}$s. An upper bound on the value of $|f_{d_x}|$ can be calculated by traversing the ROBDD of $f_d$ and taking the x=1 branch whenever the node with variable id corresponding to x is encountered. The method does not give the exact count as the BDD obtained by traversing the ROBDD in this manner is not reduced. One advantage of such an implementation is that no new nodes need to be created and the traversal is relatively quick.

Partitions may be created such that the number of partitions are chosen dynamically. In one case, each time the BDDs blow-up, partitioning is executed dynamically using splitting variables, chosen in the increment of 1, until the BDD blow-up is deemed to be circumvented.

In explosion based partitioning, the $\psi_{i_{bdd}}$s in $f_d$ is successively composed. If the graph size increases significantly for some composition (e.g. $\Psi_j$), a window function may be selected (e.g. w) based on the current $f_d$ and $\psi_{j_{bdd}}$. The window functions may be either a PI and its complement or some $\psi_{k_{bdd}}$ and its complement that is expressed in terms of PIs only and that has a small size.

Once the window function w is obtained, two partitions ($w \wedge f_{d_w}, \psi_w$), and ($\overline{w} \wedge f_{d_w}, \psi_{\overline{w}}$) may be created and the routine on each of the partitions may be recursively recalled. In general, if the resulting BDD after composition is more than ten times larger then the sum of all the previous decomposed BDDs that have already been composed and the size of original decomposed BDD, explosion based partitioning may be executed.

In a priori variable selection, as well as explosion based partitioning, a fixed number of splitting variables is determined. Explosion based partitioning followed by a fixed number of primary input variables based partitioning (or a vice-versa process) may then be executed. The explosion based partitioning can use both the primary inputs as well as pseudo-variables/decomposition points.

After selecting a window function and creating the decomposed representation for the $i^{th}$ partition given by $f_{d_w,i}$ and $\psi_{w_i}$, the final step is to compose $\psi_{w_i}$ in $f_{d_w,i}$, i.e., $f_{d_w,i}(\psi, X)$ ($\psi \leftarrow \psi_{bdd_w,i}$). Although, the final ROBDD size is constant for a given variable ordering, the intermediate memory requirement and the time for composition may be a strong function of the order in which the decomposition points are composed. For candidate variables that can be composed into $f_d$, a cost can be assigned that estimates the size of the resulting composed ROBDD. The variable with the lowest cost estimate may be composed. A decomposition variable may be chosen that leads to the smallest increase in the size of the support set of the ROBDD after composition. At each step, candidate $\psi_s$ may be restricted for composition to those decomposition points that are not present in any of the other $\psi_{bdd}$S. This may ensure that a decomposition variable needs to be composed only once in $f_d$.

POBDD techniques may be employed and an analysis, which may include imaging/preimaging operations, may be executed in order to determine a set of states element 20. POBDD techniques refers to any operation that may be executed on a data structure in order to convert it into a canonical form. Partitioned refers to the fact that the Boolean space is being broken into different subspaces.

For purposes of teaching, it is helpful to explain some of the imaging and preimaging operations that are executed in conjunction with POBDD techniques. Functions generally map one domain to a co-domain. Variables may be represented in terms of X and outputs may be represented in terms of Y. Each combination of X may result in some representation of Y. For each combination of X, there may be a unique combination that results and this may define the function. An image is what is produced as a result of certain operations associated with the function. An operation may be applied on the domain and what results is an image. For example, a number of states may be present and from those states many other states may be reached. From ten states, a thousand states may be reached within target circuit 12. The thousand states may be considered as reflecting an image associated with the ten states.

The image operation may be considered as a prism or a mirror that provides some reflection in order to project the corresponding image. For a given image, an object and a mirror are employed to derive the image. The object may be referred to as the starting ten states, whereby the mirror is the operation and the thousand states is the image set. In a similar fashion, preimaging operations may be defined. The preimage in the example provided may be represented by the one thousand states. The operation is still represented by the mirror and an object may be derived using these two variables. Thus, in the case of images, an object and a mirror are present and the reflection is sought. In the case of preimaging, the reflection and the mirror are present and what is being sought is the original object that projected the image.

The image operation in the case of a states-based analysis may be referred to as a transition/relation operation. The transition/relation operation may link the transitions that are possible in a given state space, where there are certain rules that prohibit moving from state one to state ten because links are not present. The transitions that are possible and impossible may then be captured. Thus, the mirror (transition/relation operation) may indicate what transitions are possible in the system/circuit/state.

There are only some states that may be accessed after one application of a transition/relation operation. Accordingly, after applying the transition/relation operation, movement may be effectuated from that point to a greater depth. Similarly, from state one thousand, it may be determined the values of the original states using the transition/relation operation. Accordingly, a preimage may be achieved for a given set of states. The image is the reflection of the states as provided by the mirror (transition/relation operation). Imaging and/or preimaging techniques may be used in order to determine what is deep within target circuit 12.

In another example offered for purposes of teaching, it is assumed that line 1 and line 2 are states, whereby line 1 and line 2 are parallel and separated by a transition/relation element. In certain scenarios, the reflection of line 2 affects information associated with line 1. However, what is generally sought is everything reflected by either line 1 or line 2 exclusively. The image and preimage operations may be used in order to determine what is being received from each of the lines. By using the process of subtraction, it may be determined what is included in line 1 and line 2. What is left may be referred to as genuine objects, contenders, or choices that maintain their integrity. From this information, it can be determined what is causing confusion or errors and eliminate these elements from the process.

In yet another example, consider the case where set 1 includes states 1, 2 and 3. Further consider set two, which includes states 4 and 5. All of these elements may be reflected in states 10 and 11. In analyzing states 10 and 11, a reflection is provided that is coming from states 1, 2, 3, 4, and 5. It may be recognized that it is improper to consider 4 and 5 in an analysis associated with set 1 because these elements are associated with set 2. Thus, states 4 and 5 may be subtracted from the set whereby what is left is the genuine set from set 1 (states 1, 2, and 3). The distance between sets 1 and 2 can be identified as one unit. The difference between set 2 and set 0 is two units. A calculation may then be made, at a distance of one unit, between set 1 and set 0. In a next step, the analysis may shift to set −1 and the analysis may continue to set −2 and so forth. In this sense, the information is inductively being amassed such that the analysis continues to move back in order to generate greater distances and depth. This procedure allows verification of states deeper within target circuit 12.

Appropriate time intervals may also be provided in conjunction with the sampling of multiple sub-spaces within a given circuit under test. A certain amount of time may be configured in order to evaluate various subspaces within a target. Once the time interval has expired, the process may stop and a determination may be made. The time interval may be based on expediency issues or practicality parameters associated with a given verification process. Where no deep states are found during the designated time interval, the program may be run in a difficult mode that includes a larger time out value. Alternatively, the manner in which the selection was executed may change such that any of the already sampled sub-spaces (or types of spaces) are not revisited. By giving a guarantee or a fixed proof that a deep state will be encountered, a significant gain in efficiency may be achieved with a minimal loss. This gain in efficiency may be disproportionately high as compared to the loss.

In operation of an example implementation, assume that target circuit 12 includes one hundred states. Two partitions may be present, partition #1 and partition #2. While executing calculations on a selected partition, a computation may be made for a state that reflects a behavior being violated in target circuit 12. As states are being computed, some checks may also be executed such that the erroneous state is determined quickly after it is encountered. Thus, after an erroneous state is encountered, the procedure does not move forward such that the erroneous state is not maintained. After locating the suspect area, a determination is made as to how the erroneous state was encountered. For example, the erroneous state may have been encountered by a communication involving partition #1 and partition #2. Alternatively, the erroneous state may have been encountered by communication associated with only partition #1 or partition #2. The initial state may then be determined by translating back the path (from the initial state) to the erroneous state. There may be multiple paths moving backward associated with the erroneous state. In such a case, the optimal path may be chosen or otherwise designated by the end user.

In the example provided, assume further that some state has been computed or otherwise detected in partition #1 that reflects a flaw in target circuit 12. For purposes of example, further assume that the flaw or error was caused by a communication from partition #1 to partition #2. It may also be deduced that the state is a result of applying transition/relation operations to the initial state. A transition/relation operation is applied to a particular state (initial) in order to generate an intermediate state (to partition #2) and then from the intermediate point to partition #1. It may now be determined that state eighty is associated with the erroneous state. This represents a way to move from state eighty (the error) to partition #2 and then to the initial state. This may further allow for the reduction in wasted computations in exploring entire areas of target circuit 12 instead of pinpointing the exact erroneous location.

FIG. 2 is a simplified flow chart illustrating a series of example steps associated with a method for evaluating an erroneous state associated with target circuit 12. The method may begin at step 100 where a designer evaluates a particular circuit, such as target circuit 12, and focuses on some property that needs to be verified. A parameter may be communicated or provided to POBDD data structure 14 and a time out interval may also be provided for the program. For example, it may be designated that the program being executed by POBDD data structure 14 should not exceed five-thousand seconds. If this process is executed within the time interval, the process may be deemed to be satisfied. In cases where the program is not executed within the time interval, the maximum depth achieved may be displayed. Alternatively, the time out interval may be modified and the program performed again. In other cases, the sub-space sampling location may be appropriately changed such that an optimal depth is reached.

After information associated with target circuit 12 is received, one or more POBDD operations may be executed by POBDD data structure 14 at step 102. POBDD data structure 14 may use designer information 24 in order to identify an erroneous state associated with a sub-space within target circuit 12. At step 104, auxiliary data structure 20 may invoke a selected algorithm in order to execute one or more computations associated with target circuit 12. At step 106, the computations may be used in order to identify a path associated with the error. The path reflects a correlation between an initial state associated with the error and the erroneous state identified. At step 108, the designer may recognize the erroneous state and path associated therewith such that imperfections or flaws within target circuit 12 may be resolved or otherwise addressed. For example, this information may then be used in order to correct or amend problems or specifications associated with the manufacturing or design process. In addition, the information or resultant may be used to fix a corresponding product such that it meets the criteria provided by the designer. Alternatively, this information may be used for any other suitable purpose.

Some of the steps illustrated in FIG. 2 may be changed or deleted where appropriate and additional steps may also be added to the flowchart. These changes may be based on specific verification architectures or particular error-trace protocols, arrangements, or configurations and do not depart from the scope or the teachings of the present invention.

Although the present invention has been described in detail with reference to particular embodiments, system 10 may be extended to any scenario in which verification is sought for a given target that has been designed or manufactured to perform a selected task or to include a designated property. Moreover, significant flexibility is provided by system 10 in that any suitable one or more components may be replaced with other components that facilitate their operations. For example, although system 10 has been described with reference to particular components such as auxiliary data structure 20, POBDD data structure 14, and algorithm element 16, these elements may be provided in a single integral unit where appropriate or replaced with devices that effectuate their functions. POBDD data structure 14 may be used with any other suitable error-trace protocols in order to enhance the verification capabilities of system 10.

In addition, although system 10 has been described with reference to one or more discreet components, additional intermediate components may be provided to system 10 in order to facilitate the processing operations thereof. For example, additional components may be used in the communication of information between auxiliary data structure 20 and POBDD data structure 14. The present invention enjoys considerable versatility in that these components may be capable of operating in conjunction with various intermediate processing elements, in any suitable fashion, that facilitate the verification procedure for a given target element or object.

Numerous other changes, substitutions, variations, alterations, and modifications may be ascertained by those skilled in the art and it is intended that the present invention encompass all such changes, substitutions, variations, alterations, and modifications as falling within the spirit and scope of the appended claims. Moreover, the present invention is not intended to be limited in any way by any statement in the specification that is not otherwise reflected in the appended claims.

What is claimed is:

1. An apparatus for evaluating an erroneous state associated with a target circuit, comprising:

a partitioned ordered binary decision diagram (POBDD) data structure comprising logic encoded on a first computer-readable storage medium, the POBDD data structure operable to receive information associated with a target circuit, the information identifying a property within the target circuit to be verified, the POBDD data structure executing one or more operations in order to identify an erroneous state associated with a sub-space within the target circuit; and an auxiliary data structure comprising logic encoded on a second computer-readable storage medium, the auxiliary data structure operable to:

store a trace record comprising one or more computations, one or more communications between at least two partitions, and one or more time intervals associated with the one or more communications; and identify a path associated with the erroneous state, the path reflecting a correlation between an initial state associated with the erroneous state and a point where the erroneous state was encountered by the POBDD data structure.

2. The apparatus of claim 1, further comprising:
an algorithm element coupled to the POBDD data structure, wherein the algorithm element includes one or more algorithms that may be executed in order to verify the property included within the target circuit.

3. The apparatus of claim 2, wherein the algorithm element includes an error-trace algorithm that is invoked by the auxiliary data structure in order to identify the path.

4. The apparatus of claim 3, wherein the error-trace algorithm stores data associated with the path such that once the erroneous state is identified the initial state may be determined.

5. The apparatus of claim 1, wherein one or more imaging operations are executed on the information in order to generate a set of states associated with verifying the property.

6. The apparatus of claim 5, wherein one or more preimaging operations are executed on the information in order to generate the set of states associated with verifying the property.

7. The apparatus of claim 1, wherein the auxiliary data structure executes a computation associated with a parameter for the path, the computation being selected from the group consisting of:
a partition associated with the erroneous state;
a time interval associated with when the POBDD data structure encountered the erroneous state; and
a memory consumption characteristic associated with identifying the erroneous state.

8. The apparatus of claim 1, wherein the information includes a time interval in which the POBDD data structure executes verification of the target circuit.

9. A method for evaluating an erroneous state associated with a target circuit, comprising:
receiving information associated with a target circuit, the information identifying a property within the target circuit to be verified;
executing one or more partitioned ordered binary decision diagram (POBDD) operations using the information in order to identify an erroneous state associated with a sub-space within the target circuit;
storing a trace record comprising one or more computations, one or more communications between at least two partitions, and one or more time intervals associated with the one or more communications; and
identifying a path associated with the erroneous state, the path reflecting a correlation between an initial state associated with the erroneous state and a point where the erroneous state was encountered.

10. The method of claim 9, further comprising:
executing one or more algorithms in order to verify the property associated with the target circuit.

11. The method of claim 9, further comprising:
executing an error-trace algorithm in order to identify the path associated with the erroneous state.

12. The method of claim 9, further comprising:
executing one or more imaging operations on the information in order to generate a set of states associated with verifying the property.

13. The method of claim 12, further comprising:
executing one or more preimaging operations on the information in order to generate the set of states associated with verifying the property.

14. The method of claim 9, wherein the information includes a time interval in which verification is executed on the target circuit.

15. The method of claim 9, further comprising:
generating a resultant that reflects an integrity parameter associated with the property being verified, the integrity parameter identifying whether one or more errors are present in the target circuit.

16. A computer readable storage medium for evaluating an erroneous state associated with a target circuit, the computer readable medium comprising code operable when executed by a processor to:
receive information associated with a target circuit, the information identifying a property within the target circuit to be verified;
execute one or more partitioned ordered binary decision diagram (POBDD) operations using the information in order to identify an erroneous state associated with a sub-space within the target circuit;
store a trace record comprising one or more computations, one or more communications between at least two partitions, and one or more time intervals associated with the one or more communications; and
identify a path associated with the erroneous state, the path reflecting a correlation between an initial state associated with the erroneous state and a point where the erroneous state was encountered.

17. The medium of claim 16, wherein the code is further operable when executed to:
execute one or more algorithms in order to verify the property associated with the target circuit.

18. The medium of claim 16, wherein the code is further operable when executed to:
execute an error-trace algorithm in order to identify the path associated with the erroneous state.

19. The medium of claim 16, wherein the code is further operable when executed to:
execute one or more imaging operations on the information in order to generate a set of states associated with verifying the property.

20. The medium of claim 19, wherein the code is further operable when executed to:
execute one or more preimaging operations on the information in order to generate the set of states associated with verifying the property.

21. The medium of claim 16, wherein the code is further operable when executed to:
generate a resultant that reflects an integrity parameter associated with the property being verified, the integrity parameter identifying whether one or more errors are present in the target circuit.

* * * * *